(12) United States Patent
Xu

(10) Patent No.: US 10,072,976 B2
(45) Date of Patent: Sep. 11, 2018

(54) OPTICAL SENSOR ARRANGEMENT AND METHOD FOR LIGHT SENSING

(71) Applicant: ams AG, Unterpremstaetten (AT)

(72) Inventor: Gonggui Xu, Plano, TX (US)

(73) Assignee: ams AG, Unterpremstaetten (AT)

(*) Notice: Subject to any disclaimer, the term of this patent is extended or adjusted under 35 U.S.C. 154(b) by 461 days.

(21) Appl. No.: 14/493,219

(22) Filed: Sep. 22, 2014

(65) Prior Publication Data
US 2015/0083896 A1    Mar. 26, 2015

Related U.S. Application Data

(60) Provisional application No. 61/881,734, filed on Sep. 24, 2013.

(30) Foreign Application Priority Data

Oct. 2, 2013    (EP) .................................... 13187019

(51) Int. Cl.
| | | |
|---|---|---|
| G01J 1/46 | (2006.01) | |
| G01J 1/18 | (2006.01) | |
| H03M 1/10 | (2006.01) | |
| H03M 1/12 | (2006.01) | |
| G01J 1/44 | (2006.01) | |

(52) U.S. Cl.
CPC . *G01J 1/46* (2013.01); *G01J 1/18* (2013.01); *H03M 1/10* (2013.01); *H03M 1/12* (2013.01); *G01J 2001/444* (2013.01)

(58) Field of Classification Search
CPC ....... G01J 1/4204; G01J 1/46; H01L 27/1443; G01R 31/26

USPC ............ 250/214 A, 214 LA, 214 LS, 214 C, 250/214 R; 369/44.12, 59.21; 330/260, 330/267, 273; 348/294–312

See application file for complete search history.

(56) References Cited

U.S. PATENT DOCUMENTS

| | | | |
|---|---|---|---|
| 4,621,204 A | 11/1986 | Loessel et al. | |
| 6,961,746 B1 | 11/2005 | Tang | |
| 6,987,405 B1* | 1/2006 | Reaves ................... | H03L 7/087 327/149 |
| 2006/0180747 A1 | 8/2006 | Liang et al. | |
| 2006/0273830 A1* | 12/2006 | Suzuki ...................... | G01J 1/46 327/101 |
| 2009/0091648 A1* | 4/2009 | Lin ........................ | H04N 5/335 348/301 |
| 2010/0105155 A1* | 4/2010 | Peng ................. | G01R 31/31851 438/16 |
| 2010/0253616 A1 | 10/2010 | Omi et al. | |

(Continued)

FOREIGN PATENT DOCUMENTS

DE    4114272 A1    11/1992

OTHER PUBLICATIONS

TSL 2560, TSL 2561 "Light-to-digital converter" TAOS datasheet, Nov. 2009, pp. 1-42.

*Primary Examiner* — Georgia Y Epps
*Assistant Examiner* — Don Williams
(74) *Attorney, Agent, or Firm* — McDermott Will & Emery LLP

(57) ABSTRACT

An optical sensor arrangement (10) comprises a light sensor (11), a current source (41), an analog-to-digital converter (12) and a switch (44) which selectively couples the light sensor (11) or the current source (41) to an input (14) of the analog-to-digital converter (12).

14 Claims, 6 Drawing Sheets

(56) References Cited

U.S. PATENT DOCUMENTS

2012/0293472 A1 11/2012 Wong et al.
2014/0263972 A1* 9/2014 Chua ............... H01L 27/1443
　　　　　　　　　　　　　　　　　　　　　　250/208.2

* cited by examiner

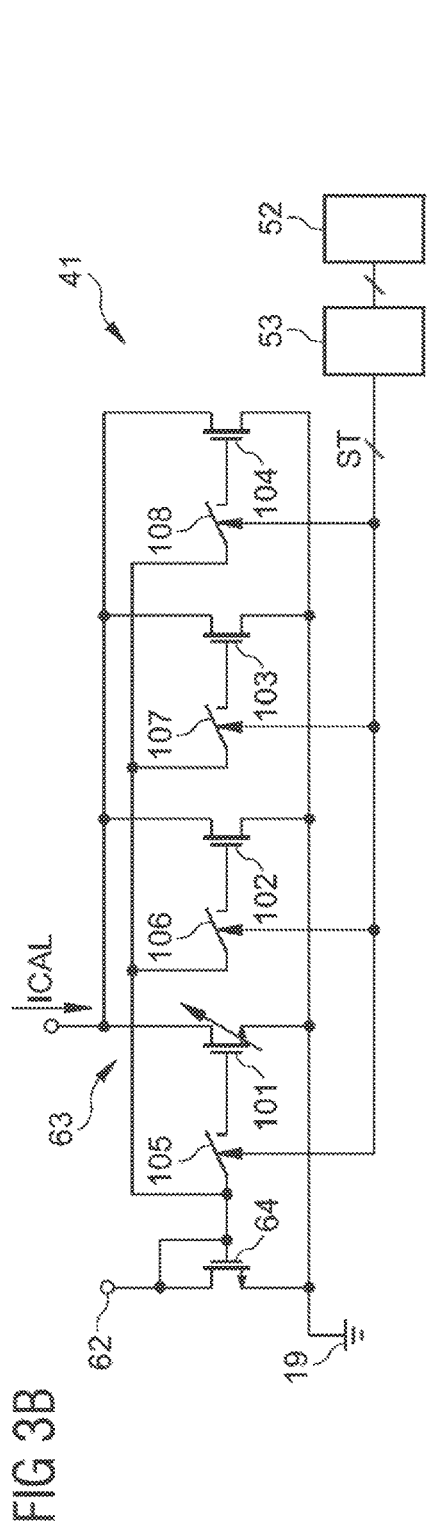
FIG 3B
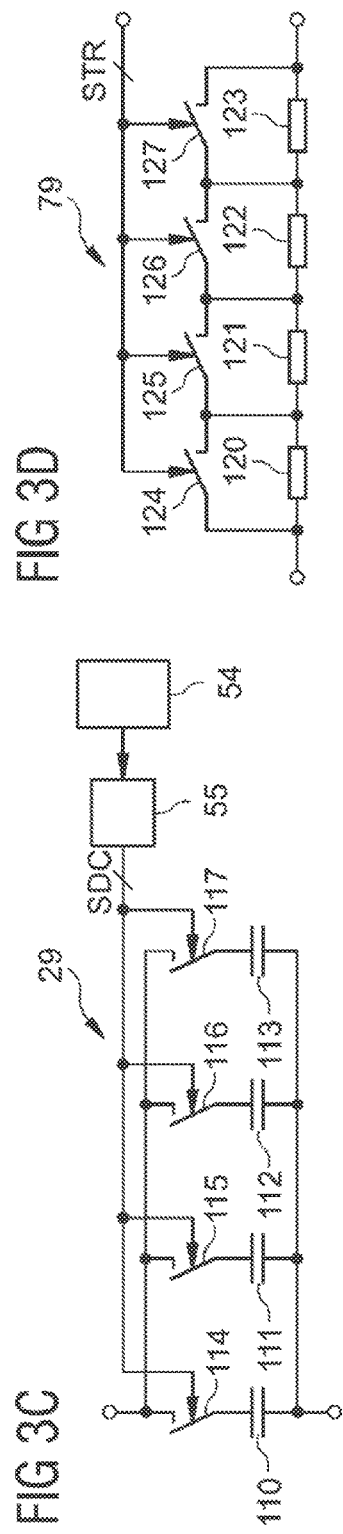
FIG 3C
FIG 3D
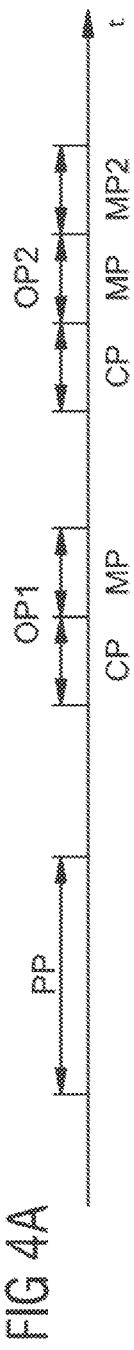
FIG 4A

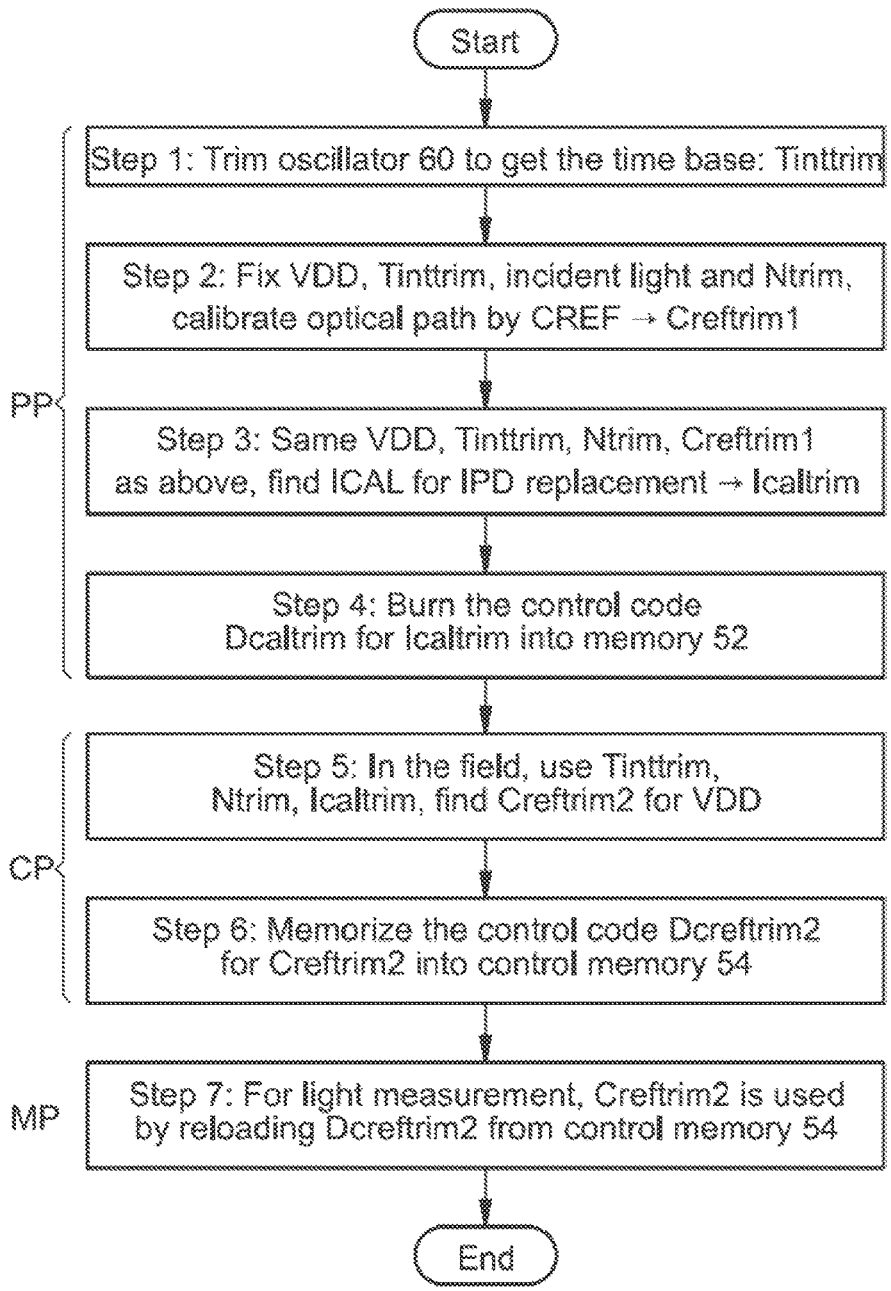

OPTICAL SENSOR ARRANGEMENT AND METHOD FOR LIGHT SENSING

CROSS-REFERENCE TO RELATED APPLICATIONS

The present application claims the benefit of priority under 35 U.S.C. § 119 from U.S. Provisional Patent Application Ser. No. 61/881,734, filed on Sep. 24, 2013, and claims priority to European Patent Application No. 13187019.8 filed on Oct. 2, 2013, both disclosures of which are hereby incorporated by reference in their entirety for all purposes.

FIELD OF THE INVENTION

The present invention is related to an optical sensor arrangement and a method for light sensing.

BACKGROUND OF THE INVENTION

Some optical sensors use a band-gap voltage reference for measurement of brightness with high accuracy. The band-gap voltage reference consumes a large area on an integrated circuit and has a high power consumption.

SUMMARY OF THE INVENTION

One object of the present application is to provide an optical sensor arrangement and a method for light sensing. In an embodiment the optical sensor arrangement may obtain a reduced power consumption and a smaller area on an integrated circuit.

In an embodiment an optical sensor arrangement comprises a light sensor, a current source, an analog-to-digital converter and a switch. The switch selectively couples the light sensor or the current source to an input of the analog-to-digital converter.

Advantageously, the current source can be used for calibration of the optical sensor arrangement. Thus, precise measurement of brightness is achieved without the use of a band-gap voltage reference that consumes a large amount of power and area on an integrated circuit.

In an embodiment the analog-to-digital converter, abbreviated to AD converter, generates a first digital output signal representing a value of a calibration current of the current source in a calibration phase and a second digital output signal representing a value of a sensor current of the light sensor in a measurement phase. At least one measurement phase may follow the calibration phase. The current source generates the calibration current. The light sensor generates the sensor current.

The influence of deviations from device to device or other errors of the AD converter is reduced, since the optical sensor arrangement performs both the calibration phase and the measurement phase.

In an embodiment the switch couples the light sensor to the input of the AD converter in the measurement phase. Correspondingly, the switch couples the current source to the input of the AD converter in the calibration phase.

In an embodiment a value of the calibration current is set by a trimming signal provided to the current source. The trimming signal is a digital signal. Thus, the current source may be configured as an adjustable current source. The trimming signal may control the value of the calibration current of the current source.

In an embodiment the current source is configured such that the value of the calibration current is set by the trimming signal provided to the current source.

In a further development the optical sensor arrangement comprises a memory. The trimming signal is determined by a value stored in the memory.

Advantageously, the value stored in the memory that is used to generate the trimming signal is determined in a production phase. The production phase precedes the calibration phase and the measurement phase. The memory may be a read-only memory. For example, the memory may be realized as a one-time programmable memory, abbreviated to OTP. Thus, the value of the calibration current can be fixed in the production phase. In an embodiment the value of the calibration current may be equal in the calibration phase and in the measurement phase.

In an embodiment the AD converter is realized as a charge balancing AD converter. The AD converter performs a charge balancing to generate the first and the second digital output signal.

Advantageously, the digitalization of the sensor current is achieved by an AD converter which needs only a small area on an integrated circuit for realization.

In an embodiment the AD converter comprises an amplifier. The switch is coupled to an input of the amplifier via the input of the AD converter.

In an embodiment the AD converter comprises an integrating capacitor. The integrating capacitor couples an output of the amplifier to the input of the amplifier. The amplifier and the integrating capacitor form an inverse integrator.

In an embodiment the AD converter comprises an integrator. The integrator may be named as integrating amplifier. The switch selectively couples the light sensor or the current source to an input of the integrator via the input of the AD converter. The integrator may comprise the amplifier and the integrating capacitor.

In an embodiment the AD converter comprises a reference capacitor. The reference capacitor is coupled to the input of the amplifier. The reference capacitor is designed for providing a charge package to the input of the amplifier.

In an embodiment the AD converter comprises a charge pump. The charge pump may comprise the reference capacitor. The charge pump may provide a charge package to the input of the AD converter and thus to the input of the integrator. The charge pump may be named as a reset circuit.

Whereas the light sensor provides a charge of a first polarity to the input of the amplifier, the reference capacitor provides a charge with a second polarity, which is opposite to the first polarity, to the input of the amplifier. The current source provides a charge of the same polarity as the light sensor to the input of the amplifier.

In an embodiment the charge package depends on a capacitance value of the reference capacitor and a voltage value of a supply voltage.

Advantageously, the charge package is generated by the supply voltage. The charge package is not generated by use of a reference voltage generated by a voltage reference source. Thus, the optical sensor arrangement is free of a reference voltage source.

Alternatively, the charge package depends on the capacitance value of the reference capacitor and a reference voltage which is derived from the supply voltage. Thus, the charge package is generated by the reference voltage. The optical sensor arrangement comprises a voltage reference that provides the reference voltage.

In an embodiment the voltage reference may not be implemented as a band-gap voltage reference source.

In an embodiment the reference capacitor is designed such that the capacitance value of the reference capacitor is set by a trim control signal. The trim control signal is a digital signal. The trim control signal is determined in the production phase and/or in the calibration phrase. Thus, the reference capacitor may be configured as an adjustable reference capacitor. The trim control signal may control the capacitance value of the reference capacitor.

In an embodiment, an adjustment of the current source and of the reference capacitor is functionally related in order to calibrate the optical sensor arrangement. The optical sensor arrangement may be named as a measuring circuit.

In an embodiment the optical sensor arrangement comprises a control memory. The trim control signal is determined by a value stored in the control memory. The control memory may be realized as a random access memory, abbreviated to RAM. Thus, the value stored in the control memory may be determined in the calibration phase. Thus, the value stored in the control memory for determining the trim control signal may be changed at the end of the calibration phase and is used in the measurement phase that follows the calibration phase.

In an embodiment the AD converter further comprises a digital control circuit. An output of the digital control circuit may be coupled to the charge pump.

In an embodiment the AD converter further comprises a comparator. The comparator couples an output of the integrator to an input of the digital control circuit.

In an embodiment a method for light sensing comprises selectively providing a calibration current of a current source or a sensor current of a light sensor to an input of an AD converter.

Either the calibration current of the current source or the sensor current of the light sensor is applied to the input of the AD converter. A calibration of the AD converter is achieved by the current source. Thus, a precise measurement of the sensor current is possible in an area-saving and power-saving way.

The optical sensor arrangement can be implemented as an ambient light sensor, abbreviated to ALS. Thus, the optical sensor arrangement is designed to measure an ambient light brightness.

A consumer electronics device may comprise the optical sensor arrangement. The optical sensor arrangement may be applied for display management. For example, the optical sensor arrangement is used for the controller of a backlight illumination. If the ambient light is bright, a higher backlight illumination for a display panel is set. If the ambient light is dark, a lower backlight illumination for the display panel can be used. By dynamically adjusting the display panel brightness, the optical sensor arrangement advantageously contributes to optimize the operation power of the display panel.

In an embodiment the optical sensor arrangement is used for controlling keyboard illumination based upon ambient lighting conditions. Alternatively, the optical sensor arrangement is used to manage exposure control in digital cameras.

Thus, the optical sensor arrangement may be part of a notebook/tablet PC, a liquid crystal display monitor, a flat-panel television apparatus, a cell phone and/or a digital camera. In addition, the optical sensor arrangement may be part of security lighting, a streetlight control, sunlight harvesting, machine vision and/or an automotive instrumentation cluster.

BRIEF DESCRIPTION OF THE DRAWINGS

The following description of figures of exemplary embodiments may further illustrate and explain the invention. In so far as components, circuits and method steps correspond to one another in terms of their function in different figures, the description thereof is not repeated for each of the following figures.

FIGS. 3A to 3D show exemplary embodiments of parts of the optical sensor arrangement; and FIGS. 4A and 4B shows exemplary embodiments of a trimming process of the optical sensor arrangement.

DETAILED DESCRIPTION OF THE DRAWINGS

Figure 1:
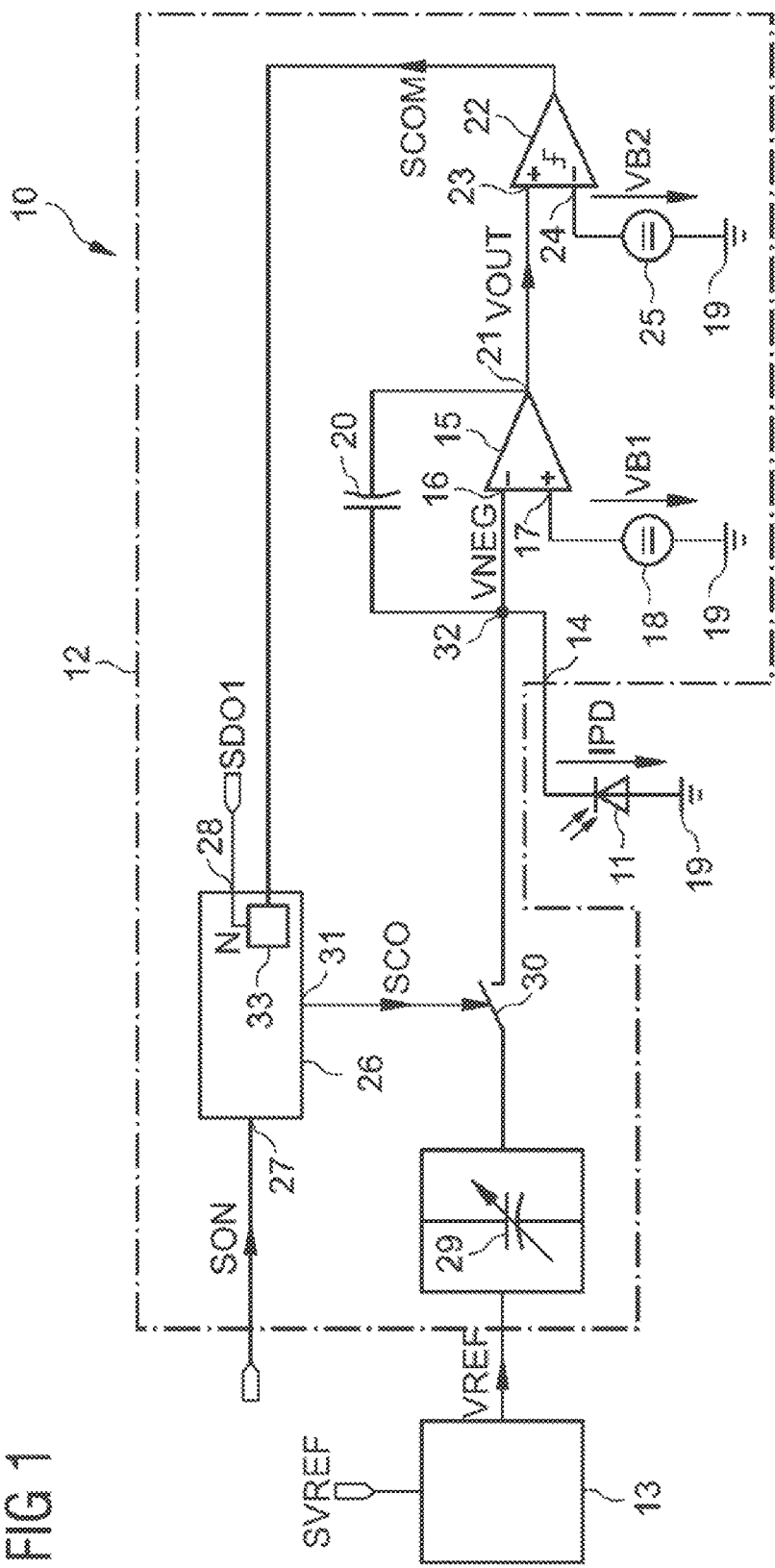
FIG. 1 shows an exemplary embodiment of an optical sensor arrangement.

FIG. 1 shows an exemplary embodiment of an optical sensor arrangement 10. The optical sensor arrangement 10 comprises a light sensor 11 and an analog-to-digital converter 12, abbreviated to AD converter. The light sensor 11 is implemented as a photodiode. Moreover, the optical sensor arrangement 10 comprises a voltage reference source 13. The light sensor 11 is connected to an input 14 of the AD converter 12. The AD converter 12 comprises an amplifier 15 having an input 16 connected to the input 14 of the AD converter 12. The input 16 of the amplifier 15 is realized as an inverting input. A further input 17 of the amplifier 15 is designed as a non-inverting input. The light sensor 11 connects the input 14 of the AD converter 12 to a reference potential terminal 19. A first bias source 18 couples the further input 17 of the amplifier 15 to the reference potential terminal 19. An integrating capacitor 20 of the AD converter 12 connects the input 16 of the amplifier 15 to an output 21 of the amplifier 15. The circuit comprising the integrating capacitor 20 and the amplifier 15 can be called an integrating amplifier or an integrator.

Furthermore, the AD converter 12 comprises a comparator 22 having an input 23 that is connected to the output 21 of the amplifier 15. The input 23 of the comparator 22 is implemented as a non-inverting input. A further input 24 of the comparator 22 is realized as an inverting input. A second bias source 25 connects the further input 24 of the comparator 22 to the reference potential terminal 19. An output of the comparator 22 is connected to a digital control circuit 26 of the AD converter 12. The digital control circuit 26 comprises a start input 27 and a result output 28.

Moreover, the AD converter 12 comprises a reference capacitor 29. The reference capacitor 29 is coupled via a reference switch 30 of the AD converter 12 to the input 14 of the AD converter 12. Thus, the reference capacitor 29 is coupled to the input 16 of the amplifier 15 by the switch 30. A control output 31 of the digital control circuit 26 is connected to a control terminal of the reference switch 30. The voltage reference source 13 is coupled to the reference capacitor 29. A charge pump may comprise the reference capacitor 29 and the reference switch 30. The charge pump may be named as a reset circuit.

The light sensor 11 generates a sensor current IPD. The sensor current IPD is implemented as a photon current. The value of the sensor current IPD depends on the brightness of the light falling on the light sensor 11. The sensor current IPD flows through the light sensor 11 and the input 14 of the AD converter 12.

The light sensor 11, the input 16 of the amplifier 15 and the integrating capacitor 20 are each connected to an integration node 32. Also the reference capacitor 29 is coupled to the integration node 32 via the reference switch 30. The sensor current IPD flows from the integration node 32 to the reference potential terminal 19 with a positive value.

An input voltage VNEG is tapped at the input 16 of the amplifier 15 and thus also at the integration node 32. The first bias source 18 provides a first bias voltage VB1 to the further input 17 of the amplifier 15. The amplifier 15 generates an output voltage VOUT at the output 21. In the case that the reference switch 30 is open, the sensor current IPD is integrated on the integrating capacitor 20. The output voltage VOUT rises according to VOUT=IPD·t/CINT, wherein IPD is a value of the sensor current flowing for a duration t and CINT is a capacitance value of the integrating capacitor 20.

The output voltage VOUT of the amplifier 15 is applied to the input 23 of the comparator 22. The second bias source 25 generates a second bias voltage VB2 which is applied to the further input 24 of the comparator 22. The comparator 22 generates a comparator output signal SCOM depending on the values of the output signal VOUT and of the second bias voltage VB2. The comparator output signal SCOM has a first logical value if the output voltage VOUT is larger than the second bias voltage VB2 and has a second logical value if the output voltage VOUT is smaller than the second bias voltage VB2. The comparator output signal SCOM is provided to the digital control circuit 26. The digital control circuit 26 counts the pulses of the comparator output signal SCOM and provides the result as a digital output signal SDO of the AD converter 12.

A start signal SON is provided to the start input 27 of the digital control circuit 26. The operation of the AD converter 12 is triggered by the start signal SON. The voltage reference source 13 provides a reference voltage VREF to the reference capacitor 29. The reference capacitor 29 generates a charge package QREF. The charge package QREF has a value according to the following equation:

$$QREF = VREF \cdot CREF,$$

wherein CREF is a capacitance value of the reference capacitor 29 and VREF is a voltage value of the reference voltage. The digital control circuit 26 provides a control signal SCO to the reference switch 30. After closing the reference switch 30, the charge package QREF is applied to the integration node 32.

The optical sensor arrangement 10 may be implemented as ambient light sensor. The basic operation procedure is that the charge-balancing AD converter 12 collects the sensor current IPD that is a photon current from the light sensor 11 into counts of the optical sensor arrangement 10. The sensor current IPD is integrated into the integration node 32 and the integration capacitor 20 producing the input voltage VNEG. If the charge integrated into the integration capacitor 20 is larger than the unit charge packet QREF=CREF·VREF, a counter 33 of the digital control circuit 26 will be incremented by one and the charge on the integration capacitor 20 will be decreased by one unit charge packet. By integrating the sensor current IPD during an integration time TINT, the digital output signal SDO provided by the counter 33 will give the brightness of ambient light. The integration time TINT may be 100 ms for example.

Initially, when the start signal SON is low: the light sensor 11 is cleared; the integration capacitor 20 is cleared; the output voltage VOUT is lower than the second bias voltage VB2; the comparator output signal SCOM is low; the charge package QREF is fully charged to CREF·VREF and disconnected from the integration node 32; the counter 33 is cleared such that the digital output signal SDO is 0.

When the start signal SON is high, the sensor current IPD is integrated at the integration node 32 and the output voltage VOUT is ramping up. When the output voltage VOUT is larger than the second bias voltage VB2, the comparator output signal SCOM is high and this causes the charge packet QREF to be dumped into the integration node 32 and the digital output signal SDO at an output of the counter 33 will be incremented by one count. After the charge dumping, the output voltage VOUT is lower than the second bias voltage VB2 and the charge packet circuit is disconnected from the integration node 32 and back to recharging mode. During the integration time TINT, the number N of charge dumping (also the counts of the counter 33) will be generated according to the charge conservation equation:

$$TINT \cdot IPD = N \cdot CREF \cdot VREF$$

The voltage reference source 13 is used to generate the voltage reference VREF. Due to the manufacture/assembly process variation, there are variations on the electrical gain of the AD converter 12 and optical response of an optical path (light sensor in the form of a photo diode and package). These variations will be trimmed out in the final product by the trimming of the voltage reference source 13. A voltage control signal SVREF is applied to the voltage reference source 13 for trimming the voltage reference source 13. Said signal SVREF has a control code that is burnt into a not shown memory such as a "One Time Programmable" memory. An accurate ambient light sensing is achieved by an accurate and trimmable voltage reference source 13. The optical sensor arrangement 10 digitizes the incident light into counts. The voltage reference source 13 may be of the band-gap voltage reference type.

Figure 2A:
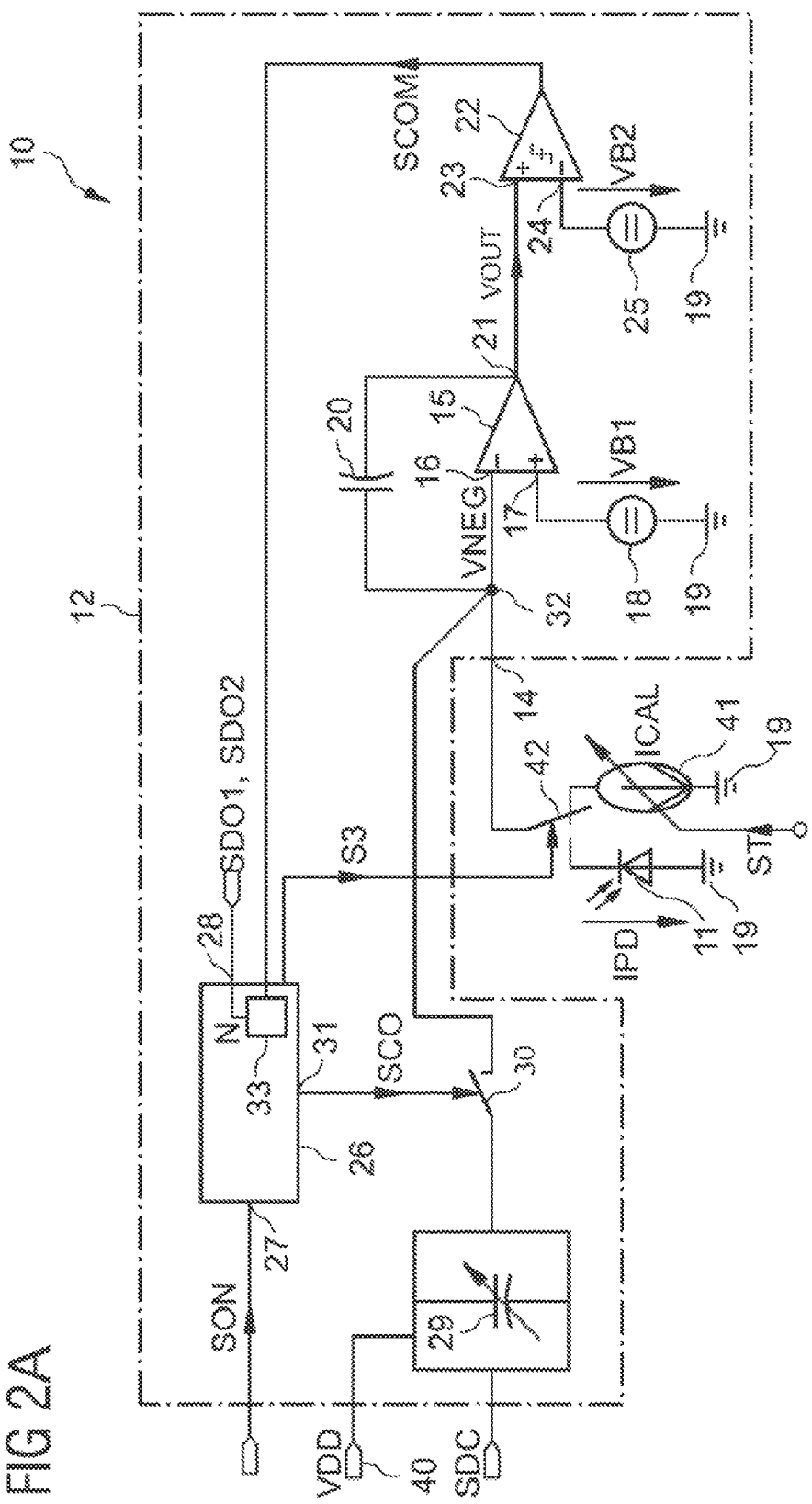
FIGS. 2A and 2B show further exemplary embodiments of the optical sensor arrangement.

FIG. 2A shows an exemplary embodiment of the optical sensor arrangement 10 which is a further development of the optical sensor arrangement shown in FIG. 1. Contrary to the optical sensor arrangement of FIG. 1, the optical sensor arrangement 10 of FIG. 2A is free of the voltage reference source 13. The optical sensor arrangement 10 comprises a supply voltage terminal 40 which is coupled to the reference capacitor 29. The reference capacitor 29 is charged by a supply voltage VDD provided at the supply voltage terminal 40.

The optical sensor arrangement 10 comprises a current source 41 and a switch 42. A first input of the switch 42 is connected to the current source 41, whereas a second input of the switch 42 is connected to the light sensor 11. An output of the switch 42 is connected via the input 14 of the AD converter 12 to the integration node 32 and to the input 16 of the amplifier 15. The amplifier 15, the comparator 22, the digital control circuit 26 and the current source 41 are connected to the supply voltage terminal 40 to be supplied by the supply voltage VDD. In a calibration phase CP, the switch 42 connects the current source 41 to the integration node 32 and the input 16 of the amplifier 15 via the input 14 of the AD converter 12. A measurement phase MP follows the calibration phase CP. In the measurement phase MP, the switch 42 connects the light sensor 11 to the integration node 32 and the input 16 of the amplifier 15 via the input 14 of the AD converter 12. The current source 41 provides a calibration current ICAL. Thus, at the end of the calibration phase CP a first digital output signal SDO1 is provided at the result output 28 of the digital control circuit 26. Correspondingly, a second digital output signal SDO2 is provided at the result output 28 of the digital control circuit 26 at the end of the measurement phase MP. The first and the second digital output signal SDO1, SDO2 represent a value of the calibration current ICAL of the current source 41 and a value of the sensor current IPD of the light sensor 11, respectively.

The charge package QREF provided by the reference capacitor 29 can be calculated according to the following equation:

$$QREF = VDD \cdot CREF,$$

wherein VDD is a value of the supply voltage and CREF is a capacitance value of the reference capacitor 29. The current source 41 is realized as a variable current source. A value of the calibration current ICAL is controlled by a trimming signal ST. The reference capacitor 29 obtains a variable capacitance value CREF. The capacitance value CREF of the reference capacitor 29 is set by a trim control signal SDC.

A measurement is performed using the following steps: The light sensor 11 in the form of a photodiode converts an incident light into the sensor current IPD. The AD converter 12 is realized as a charge-balancing AD converter. The AD converter 12 is used for a conversion of the sensor current IPD to a digital count in the form of the second digital output signal SDO2. To achieve this the sensor current IPD is integrated by an integrator comprising the amplifier 15 and the integrating capacitor 20. A charge generated by the light sensor 11 is integrated at the integration node 32. The output voltage VOUT is ramping up during integration. The comparator 22 monitors the output voltage VOUT of the integrator, i.e. the output voltage VOUT of the amplifier 15. If the output voltage VOUT is larger than the second bias voltage VB2, a charge package QREF=VDD·CREF is dumped into the integration node 32. Thus, the output voltage VOUT will be reduced by the value VDD·CREF/CINT and a number N of dumpings is increased by one count. The number N of dumpings represents the light brightness. The second digital output signal SDO2 is equal to the number N of dumpings counted by the counter 33.

Thus, the circuit architecture uses a power supply providing the supply voltage VDD to replace the voltage reference source 13 in FIG. 1. In the ambient light sensor architecture shown in FIG. 2A, the charge packet block uses the supply voltage VDD instead of the reference voltage VREF as the voltage reference. According to FIG. 1, the voltage reference source 13 is used to trim the electrical gain of the AD converter 12 and the optical gain of optical path comprising the photo diode 11 and a package. In FIG. 2A the reference capacitor 29 is used not only for trimming the electrical gain of the AD converter 12 and the optical gain of the optical path, but also for calibration of the supply voltage VDD dynamically.

Figure 2B:
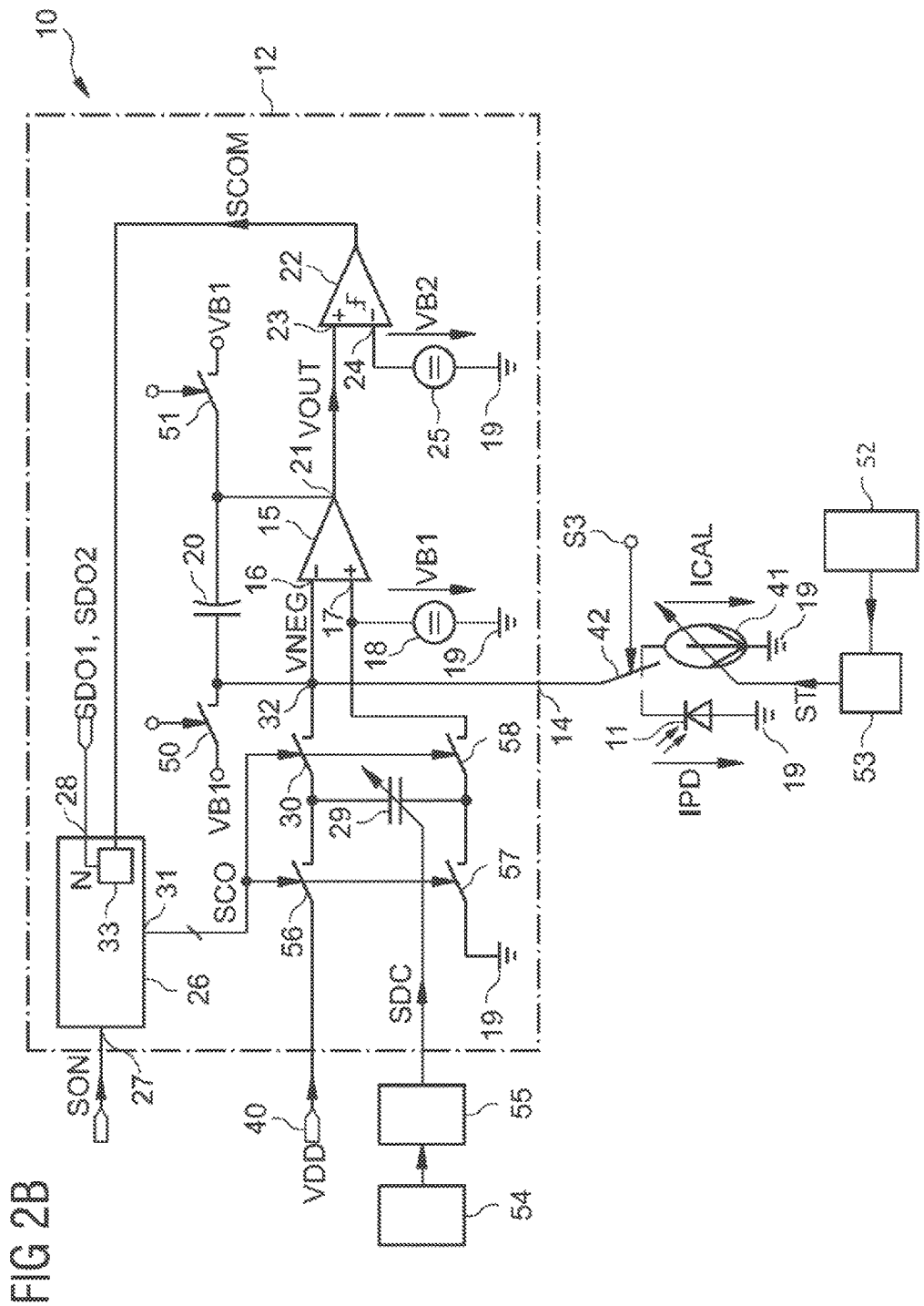

For optical gain trimming and calibration of the supply voltage VDD, the current source 41 is added in parallel to the light sensor 11. The calibration current ICAL provided by the current source 41 acts as a reference current. During a production test, the optical gain is trimmed first and the information is temporally stored into the reference capacitor 29. The gain trimming information of the reference capacitor 29 will be transferred into the current source 41 as the trimming signal ST. The control code of the trimming signal ST will be burnt into a one time programmable memory 52 abbreviated to OTA, as shown in FIG. 2B. In the field, for supply voltage VDD calibration, the current source 41 is controlled by the trimming signal ST and is used as current reference and the reference capacitor 29 will be used again to calibrate the supply voltage VDD. The final calibrated reference capacitor 29 will be used for ambient light sensing.

The proposed circuit architecture operation is similar to the operation of the embodiment shown in FIG. 1. Initially, when the start signal SON is low: The light sensor 11 in the form of a photodiode is cleared; the integration capacitor 20 is cleared; the output voltage VOUT is lower than the second bias voltage VB2; the comparator output signal SCOM is low; the reference capacitor 29 is fully charged with the charge package QREF and disconnected from the integration node 32; the counter 33 is cleared so that the digital output signal SDO1, SDO2 is 0.

When the start signal SON is high the sensor current IPD of the photodiode 11 is integrated at the integration node 32 and the output voltage VOUT is ramping up. When the output voltage VOUT is larger than the second bias voltage VB2, the comparator output signal SCOM is high and this causes the charge packet QREF to be dumped into the integration node 32. Therefore, the digital output signal SDO1, SDO2 of the counter 33 will be incremented by one count. After the charge dumping the output signal VOUT is lower than the second bias voltage VB2 and the charge packet circuit is disconnected from the integration node 32 and back to recharging mode. The number N of charge dumping is equal to the counts of the counter 33 of the AD converter 12 and will be generated over a certain period of the integration time TINT.

For optical gain trimming and supply voltage calibration, the light sensor 11 and the reference current source 41 are switched in and out by the switch 42. The switch 42 is controlled by a switch control signal S3. If the switch control signal S3=0, the sensor current IPD is selected and integrated and the AD converter 12 will sense the ambient light. If the switch control signal S3=1, the current source 41 is selected and the calibration current ICAL is integrated; thus, the AD converter 12 trims the optical path or calibrates the supply voltage VDD. Depending on the polarity of the switch control signal S3, the bias voltage source 18 may provide the first bias voltage VB1 having different voltage values. Thus, the further input 17 of the amplifier 15 receives different voltage values controlled by the switch control signal S3. The amplifier 15 may be implemented as an integration operational amplifier.

The bias sources 18, 25 are not realized as reference voltages. The first and the second bias voltage VB1, VB2 are for circuit operation only. Their precisions are not required since they do not influence the charge packet and sensor gain. Their voltage level determines a circuit operation DC bias level. Therefore, as long as the circuit design gives enough room for DC biasing, very loose values can be used for the first and the second bias voltage VB1, VB2.

In the following, the operational procedure of the optical sensor arrangement 10 is explained in detail. For a stable ambient light sensor and for any fixed incident light, the same sensor reading (number N of counts, respectively the second digital output signal SDO2) should be achievable for different parts, different supply voltages VDD and different temperature. Therefore, the optical sensor arrangement 10 performs a trimming/calibration procedure. Said procedure uses the basic charge conservation equation for the ambient light sensor:

$$TINT \cdot IPD = N \cdot CREF \cdot VDD,$$

wherein TINT is the integration time; IPD is the sensor current of the light sensor 11; N is the output count of the AD converter 12 which is equal to the second digital output signal SDO2 and to the number N of dumpings; CREF is the capacitance value of the reference capacitor 29; VDD is the value of the supply voltage of the power supply for the optical sensor arrangement 10. There are several observations for the trimming/calibration:

Since there are five variables in above equation, at least three variables should be fixed at any trimming/calibration step.

While some of the trimming variables such as the integration time TINT and the sensor current IPD can be done at production test, the supply voltage VDD has to be calibrated in the field.

Figure 3A:
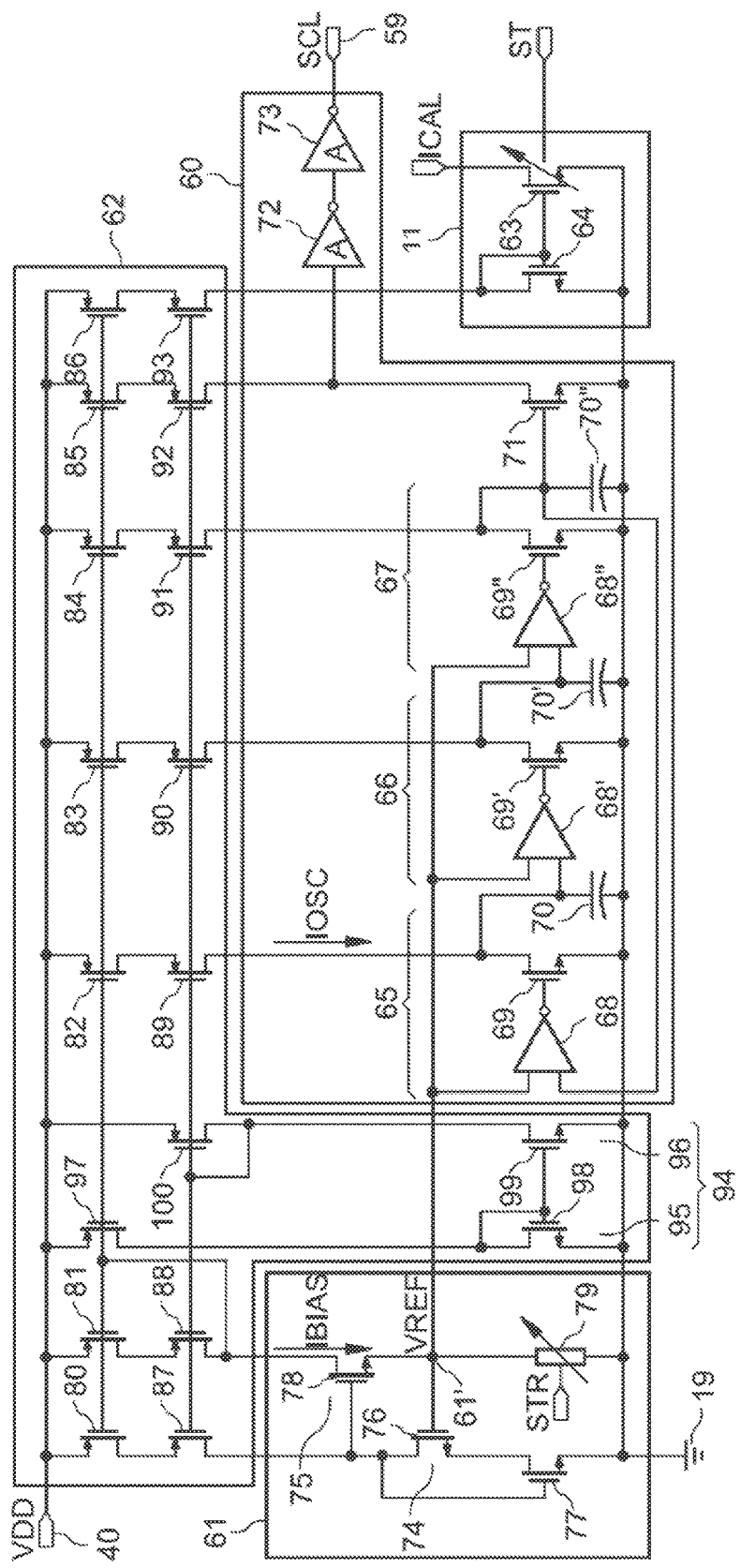

To simplify the trimming/calibration, the trimming variables such as the integration time TINT, the sensor current IPD and the capacitance CREF can be assumed to be independent of the supply voltage VDD and the temperature: This is achievable by proper design (as shown in FIG. 3A) and proper passive component selection.

For successful supply voltage VDD calibration in the field, a special calibration current ICAL has to be generated. The main idea is to track TINT and ICAL variation over the supply voltage VDD and the temperature from each other such that the product TINT·ICAL is constant even in case of a supply voltage VDD and temperature change.

The optical sensor arrangement 10 uses an alternate reference, for example power supply and MOSFET references, in comparison to an embodiment using a precise voltage reference such as a band gap voltage. The elimination of a band gap voltage reference saves silicon area and cost. The elimination of voltage reference buffers advantageously saves power. The optical sensor arrangement 10 may be free of a bipolar transistor.

FIG. 2B shows an alternative embodiment of the optical sensor arrangement 10 which is a further development of the arrangements shown in FIGS. 1 and 2A. The AD converter 12 comprises a first and a second discharging switch 50, 51 which connect a first terminal and a second terminal of the integrating capacitor 20 to the first bias source 18 or to the reference potential terminal 19. The optical sensor arrangement 10 comprises the memory 52 which is coupled to a control terminal of the current source 41. A signal generator 53 is arranged between the memory 52 and the control terminal of the current source 41. A value Dcaltrim stored in the memory 52 determines the trimming signal ST. The trimming signal ST is generated by the signal generator 53 using the value Dcaltrim stored in the memory 52.

Moreover, the optical sensor arrangement 10 comprises a control memory 54 that is coupled to a control terminal of the reference capacitor 29. A control signal generator 55 is arranged between the control memory 54 and the control terminal of the reference capacitor 29. A trim control signal SDC is set using a value Dcreftrim2 stored in the control memory 54. The control signal generator 55 generates the trim control signal SDC using the value Dcreftrim2 stored in the control memory 54.

The AD converter 12 comprises a first to a third reference switch 56 to 58. The first reference switch 56 couples the supply voltage terminal 40 to a first electrode of the reference capacitor 29. The first electrode of the reference capacitor 29 is coupled to the input 16 of the amplifier 15 via the reference switch 30. The second reference switch 57 couples the reference potential terminal 19 to a second electrode of the reference capacitor 29. The third reference switch 58 couples the first bias source 18 to the second electrode of the reference capacitor 29. For charging the reference capacitor 29 the first and the second reference switch 56, 57 are closed and the third reference switch 58 and the reference switch 30 are opened by the control signal SCO. For dumping the charge package QREF, the first and the second reference switch 56, 57 are opened and the third reference switch 58 and the reference switch 30 are closed by the control signal SCO. The charge pump may comprise the reference capacitor 29, the reference switch 30 and the first to the third reference switch 56 to 58.

A further output of the digital control circuit 26 is coupled to a control terminal of the switch 42. The switch control signal S3 provided to the control terminal of the switch 42 is also provided to a control terminal of the first bias generator 18. Thus, the first bias voltage VB1 depends on the position of the switch 42. The switch 42 is designed to additionally have an open state. In the open state the switch 42 connects neither the light sensor 11 nor the current source 41 to the integration node 32 and the input 16 of the amplifier 15. The open state of the switch 42 is an idle state during which the integration capacitor 20 is discharged for example.

FIG. 3 shows an exemplary embodiment of details of the optical sensor arrangement 10, especially details of analog circuit parts of the optical sensor arrangement 10. As shown in FIG. 3, the optical sensor arrangement 10 comprises the current source 11, an oscillator 60, a voltage reference 61 and a bias circuit 62. The bias circuit 62 provides currents for the voltage reference 61, the oscillator 60 and the current source 11. The bias circuit 62 is designed in the form of a current mirror.

The current source 11 is realized as a current mirror. The current source 11 comprises a first and a second current source transistor 63 and 64. The first current source transistor 63 couples the switch 42 and thus the input 14 of the amplifier 15 to the reference potential terminal 19. The first current source transistor 63 is trimmed by the trimming signal ST. The second current source transistor 64 couples an output of the bias circuit 62 to the reference potential terminal 19. A control terminal of the first current source transistor 63 is connected to a control terminal of the second current source transistor 64 and to a node between the second current source transistor 64 and the bias circuit 62.

The oscillator 60 comprises a first to a third stage 65 to 67. The first stage 65 of the oscillator 60 comprises an oscillator amplifier 68, an oscillator transistor 69 and an oscillator capacitor 70. The oscillator amplifier 68 is realized as an operational amplifier. An input of the oscillator amplifier 68 of the first stage 65 is connected to an output of the third stage 67. A further input of the oscillator amplifier 68 is connected to a reference output 61' of the voltage reference 61. The oscillator amplifier 68 controls the oscillator transistor 69. The oscillator transistor 69 couples a further output of the bias circuit 62 to the reference potential terminal 19. A node between the oscillator transistor 69 and the bias circuit 62 is coupled via the oscillator capacitor 70 to the reference potential terminal 19 and forms an output of the first stage 65 of the oscillator 60.

The output of the first stage 65 is connected to an input of a further oscillator amplifier 68' of the second stage 66. A further input of the further oscillator amplifier 68' is connected to the reference output 61'. The second and the third stage 66, 67 are constructed similarly to the first stage 65. Thus, the second stage comprises a further oscillator transistor 69' and a further oscillator capacitor 70'. An output of the second stage 66 is connected to an input of an additional oscillator amplifier 68" of the third stage 67. A further input of the additional oscillator amplifier 68" is connected to the reference output 61'. The third stage 67 comprises an additional oscillator transistor 69" and an additional oscillator capacitor 70". An output transistor 71 of the oscillator 60 couples a further output of the bias circuit 62 to the reference potential terminal. The output transistor 71 of the oscillator 60 is controlled by the output of the third stage 67.

Furthermore, the oscillator 60 comprises a first and a second inverter 72, 73 which are connected in series. A node between the bias circuit 62 and the output transistor 71 is coupled to a clock terminal 59 via the series circuit of the first and the second inverter 72, 73. At the oscillator output 59 a clock signal SCL is tapped.

The voltage reference 61 comprises a first and a second branch 74, 75. The first branch 74 of the voltage reference 61 comprises a first and a second reference transistor 76, 77 which are connected in series. The series connection of the first and the second reference transistor 76, 77 couples a further output of the bias circuit 62 to the reference potential terminal 19. A controlled section of the second reference transistor 77 is connected to the reference potential terminal 19, whereas a controlled section of the first reference transistor 76 is connected to the bias circuit 62. The second branch 75 of the voltage reference 61 comprises a third reference transistor 78 and a reference resistor 79 which form a series circuit. The series circuit of the third reference transistor 78 and the reference resistor 79 couples a further output of the bias circuit 62 to the reference potential terminal 19. The reference resistor 79 is connected to the reference potential terminal 19, whereas the third reference transistor 78 is connected to the bias circuit 62. A node between the bias circuit 62 and the series connection of the first and the second reference transistor 76, 77 is connected to a control terminal of the second reference transistor 77 and to a control terminal of the third reference transistor 78.

The reference resistor 79 is variable. The reference resistor 79 is trimmed by a resistor control signal STR. A node between the third reference transistor 78 and the reference resistor 79 forms the reference output 61'. The reference output 61' is connected to a control terminal of the first reference transistor 76. A reference voltage VREF is tapped at the reference output 61'. Thus, the reference voltage VREF is a voltage which is tapped across the reference resistor 79 of the voltage reference 61. A bias current IBIAS flows through the second branch 75. Thus, the reference voltage VREF can be calculated according to VREF=RP·IBIAS, wherein RP is a resistance value of the reference resistor 79 and IBIAS is a current value of the bias current flowing through the second branch 75 of the voltage reference 61. The voltage reference 61 is not realized as a band-gap reference voltage source.

The bias circuit 62 is implemented as a current mirror and comprises several branches. The bias circuit 62 is realized as a cascaded bias circuit. The current source transistors 63, 64, the oscillator transistors 69, 69', 69'' of the first, the second and the third stage 65 to 67 and the first and the second branch 74, 75 of the voltage reference 61 are each coupled via a series circuit of one of the first bias transistors 80 to 86 and one of the second bias transistors 87 to 93 to the supply voltage terminal 40. The first bias transistors 80 to 86 are connected to the power supply terminal 40, whereas the second bias transistors 87 to 93 are connected to the current source 11, the oscillator 60 and the voltage reference 61. The control terminals of the first bias transistors 80 to 86 are connected to each other. Similarly, the control terminals of the second bias transistors 87 to 93 are connected to each other. The control terminals of the first bias transistors 80 to 86 are connected to a node between the second branch 75 of the voltage reference 61 and the bias circuit 62 and, thus, to a node between the third reference transistor 75 and the bias circuit 62.

The bias circuit 62 comprises a bias control circuit 94. The control circuit 94 comprises a first and a second branch 95, 96. The first branch 95 comprises a first and a second control transistor 97, 98 which form a series circuit between the supply voltage terminal 40 and the reference potential terminal 19. A control terminal of the first control transistor 97 is connected to the control terminals of the first bias transistors 80 to 86. The second branch 96 of the bias control circuit 94 comprises a third and a fourth control transistor 99, 100 which form a series circuit coupling the supply voltage terminal 40 to the reference potential terminal 19.

The second and the third control transistors 98, 99 form a current mirror. A control terminal of the second control transistor 98 is connected to a control terminal of the third control transistor 99 and to a node between the first and the second control transistor 97, 98. The second and the third control transistors 98, 99 are connected to the reference potential terminal 19. The first and the second control transistors 91, 100 are connected to the supply voltage terminal 40. A control terminal of the fourth bias transistor 100 is connected to the control terminals of the second bias transistors 87 to 93. The first and the fourth control transistors 97, 100 are connected to the supply voltage terminal 40. The control terminal of the fourth control transistor 100 is connected to a node between the third and the fourth control transistor 99, 100. Thus, the bias circuit 62 forms a current mirror which itself is controlled by a further current mirror formed by the third and the fourth control transistor 98, 99.

The transistors of the current source 11, the oscillator 60, the voltage reference 61 and the bias circuit 62 are realized as field-effect transistors. Said transistors are designed as metal-oxide-semiconductor field-effect transistors. The transistors 76-78 of the voltage reference 61, the transistors 69, 69', 69'' of the oscillator 60, the transistors 63, 64 of the current source 11 and the transistors 98, 99 of the bias circuit 62 are implemented as n-channel field-effect transistors. The transistors 80-86, 87-93, 97, 100 of the bias circuit 62 are implemented as p-channel field-effect transistors.

The oscillator 60 generates the integration time TINT through the clock output 59 and the calibration current ICAL. The oscillator 60 is a three stage oscillator: The oscillator amplifier 68, the oscillator transistor 69, the oscillator capacitor 70, the first bias transistor 82 and the second bias transistor 89 form the first stage 65. The further oscillator amplifier 68', the further oscillator transistor 69', the further oscillator capacitor 70', the first bias transistor 83 and the second bias transistor 90 form the second stage 66. The additional oscillator amplifier 68'', the additional oscillator transistor 69'', the additional oscillator capacitor 70'', the first bias transistor 84 and the second bias transistor 91 form the third stage 67.

The integration time TINT is a multiple of the oscillator period of the clock signal SCL such as TINT=n·Tperiod. Each stage 65-67 uses same value of a charge current IOSC and the oscillator capacitors 70, 70', 70'' obtain the same capacitance value COSC. An oscillator frequency of the clock signal SCL is proportional to IOSC/COSC. An oscillator period of the clock signal SCL and, thus, the integration time TINT are proportional to COSC/IOSC. A bias current IBIAS flows through the first bias transistor 81 and is mirrored to the first bias transistor 86 and additionally to the first current source transistor 63. The charge current IOSC is mirrored from the bias current IBIAS and the bias current IBIAS is generated from a gate voltage over the reference resistor 79. Since the calibration current ICAL is a mirror current from the bias current IBIAS, the calibration current ICAL is proportional to the charge current IOSC. Therefore, for any particular part or die, the capacitance COSC will be fixed and the product TINT·ICAL is constant over the supply voltage VDD and temperature to the first order.

The frequency of the clock signal SCL of the oscillator 60 and the integration time TINT is trimmed by the reference resistor 79 through a resistor control signal STR. When the integration time TINT is trimmed, the calibration current ICAL will also be trimmed accordingly. In addition, the calibration current ICAL is programmed by varying the size of the first current source transistor 63 controlled by the trimming signal ST having the control code Dcaltrim. This additional control over the calibration current ICAL is used to memorize sensor's optical gain trimming. The trimming of the calibration current ICAL is performed before the calibration of the reference capacitor 29 reducing the influence of a drift of the supply voltage VDD.

The voltage reference 61 is formed by the first and the second reference transistors 76, 77 and the reference resistor 79 and needs only a very small area on an integrated circuit. There are several observations on how this constant reference voltage VREF is generated. First of all, the current through the first and the second reference transistors 76, 77 are a mirrored copy of the bias current IBIAS flowing through the reference resistor 79. Secondly, a voltage/current relationship through the first reference transistor 76 mainly follows square law:

$$Ids = 0.5 \cdot \mu \cdot Cox \cdot W/L \cdot (Vgs - Vth)^2,$$

wherein Ids is a drain current, $\mu$ is a mobility of the charge carriers, Cox is a gate capacitance, W/L is a width-to-length ratio, Vgs is a gate to source voltage and Vth is a threshold voltage of the first reference transistor 76. The drain source voltage Vds of the second reference transistor 77 will alter this square law relationship slightly; voltage/current relationship over the reference resistor 79 is linear; two I/V curves will determine the voltage/current VREF/IBIAS. Thirdly, the cascading bias for the first and the second current branches 74, 75 will reduce power supply dependence. Fourthly, the threshold voltage Vth of reference transistors 76-78 has a negative temperature coefficient; the mobility $\mu$ of the reference transistors 76-78 has a positive temperature coefficient; if the first reference transistor 76 is biased properly, the temperature coefficient of Vth and the temperature coefficient of $\mu$ can cancel each other; the gate source voltage VGS can be constant over temperature if the threshold voltage Vth and the mobility $\mu$ compensate each other. The reference voltage VREF and the bias current IBIAS are mainly determined by the first reference transistor 76 that operates in saturation, the second reference transistor 77 that operates in the linear region and the reference resistor 79; the second reference transistor 77 in linear region gives an additional design freedom over temperature stability for constant reference voltage VREF and bias current IBIAS. Thus, a constant voltage/current VREF/IBIAS over power supply and temperature can be generated for the oscillator 60 and the calibration current ICAL.

The oscillator amplifiers 68, 68', 68" are implemented as operational amplifiers. Said amplifiers 68, 68', 68" are used to control a voltage swing of the oscillator 60 and to sharpen the oscillator transition between low and high states. The voltages at the outputs of the first to the third stage 65-67 swing between the reference voltage VREF and ground at the reference potential terminal 19. Sharp transition increases temperature independence for the oscillator transistors 70, 70', 70" which act as pull-low transistor. The oscillator amplifiers 68, 68', 68" are realized as simple differential pairs to reduce power consumption.

The calibration current ICAL is provided by means of the oscillator current IOSC, depending on the biasing current IBIAS. Before calibration to reduce the influence of variations of the supply voltage VDD, the calibration current ICAL is trimmed first to memorize optical gain calibration. The charge conservation equation gives a relationship:

$$TINT \cdot ICAL = Ntrim \cdot CREF \cdot VDD = \text{constant}$$

The product TINT·ICAL is constant over supply voltage VDD and temperature, since TINT and ICAL track each other in the oscillator 60. In the field, influence of deviations of the supply voltage VDD can be eliminated by calibration by using Ntrim, trimmed CREF and trimmed ICAL. The calibration for the reduction of the influence of the supply voltage VDD is done by fixing Ntrim and changing the capacitance CREF dynamically.

In an alternative not shown embodiment the oscillator 60 comprises two or more than three stages.

In an alternative not shown embodiment the voltage reference source 13 of FIG. 1 can be realized such as the voltage reference 61 shown in FIG. 3A.

FIG. 3B shows an exemplary embodiment of the current source 41. The first current source transistor 63 is realized by a parallel circuit of a number M of current transistors 101-104. The controlled sections of the number M of current transistors 101-104 are connected between the switch 42 and the reference potential terminal 19. The control terminal of the second current source transistor 64 is coupled to the control terminals of the number M of current transistors 101-104 via a number M of gate switches 105-108. The number M of gate switches are controlled by the trimming signal ST. An effective width-to-length ratio of the first current source transistor 63 is equal to the sum of the width-to-length ratios of those of the number M of current transistor 101-104 which are set in a conducting state by the trimming signal ST.

FIG. 3C shows an exemplary embodiment of the reference capacitor 29. The reference capacitor 29 is implemented as a capacitor bank. The capacitor bank comprises a number L of capacitors 110-113 and a number L of capacitor switches 114-117. Thus, a number L of series circuits each comprise a capacitor 110-113 and a capacitor switch 114-117. The number L of series circuits are connected in parallel and form the reference capacitor 29. The number L of capacitor switches 114-117 are controlled by the trim control signal SDC.

FIG. 3D shows an exemplary embodiment of the reference resistor 79. The reference resistor 79 is implemented as a resistor string. The reference resistor 79 comprises a number P of resistors 120-123 and a number P of resistor switches 124-127. The number P of resistor 120-123 are connected in series. The resistor switches 124-127 are connected in parallel to the corresponding resistors 120-123. The number P of resistor switches 124-127 are controlled by the resistor control signal STR.

FIG. 4A shows an exemplary embodiment of a trimming process flow performed by the optical sensor arrangement 10. Different phases are shown depending on a time t. The optical sensor arrangement 10 or a device comprising the optical sensor arrangement 10 is produced in the production phase PP. A production calibration is performed in the production phase PP. At the end of the production phase PP, the digital value Dcaltrim for generating the trimming signal ST is determined and stored in the memory 52. Since the memory 52 is realized as a one-time programmable memory, said value is permanently stored in the memory 52. Consequently, the trimming signal ST is fixed at the end of the production phase PP and constant in the following phases.

The optical sensor arrangement 10 is in use for light sensing during several operation phases such as an operation phase OP1 and a further operation phase OP2. The operation phases OP1, OP2 follow the production phase PP. The operation phase OP1 comprises a calibration phase CP which is followed by a measurement phase MP. The trim control signal SDC is determined during the calibration phase CP and then used during the measurement phase MP. The further operation phase OP2 comprises the calibration phase CP, the measurement phase MP and a further measurement phase MP2. Thus, the trim control signal SDC may be used for more than one measurement phase MP.

The trim control signal SDC determined in the calibration phase CP of the operation phase OP1 may be different from the trim control signal SDC determined in the calibration phase CP of the further operation phase OP2. The repeated determination of the trim control signal SDC counterbalances the influence of a change of the value of the supply voltage VDD that may change depending on the time t. Even if the charge package QREF provided by the reference capacitor 29 and an amplification factor of the amplifier 15 change their values depending on a drift of the supply voltage VDD, the second digital output signal SDO2 continuously represents the brightness of the ambient light measured by the light sensor 11. Thus, the precision of the determination of brightness is not influenced by a change in the supply voltage VDD that may be caused by power consumption of a battery powered device.

In an alternative not shown embodiment an operation phase comprises more than two measurement phases. In general, an operation phase OP comprises the calibration phase CP and a number N of measurement phases MP, wherein the number N is at least 1.

FIG. 4B shows an exemplary embodiment of a trimming sequence that is a further development of the sequence shown in FIG. 4A. The trimming procedure comprises the steps:

Step 1: In the production test during the production phase PP the oscillator frequency is trimmed first to get a time base. Thus, the integration time TINT is trimmed to get the time base Tinttrim for later operation.

Step 2: In the production test during the production phase PP a sensor optical gain is trimmed for a fixed supply voltage VDD. In the production floor, fixing of the supply voltage VDD, fixing of a light source, fixing of a target count Ntrim, and fixing of the integration time Tinttrim is performed and the optical path (photo diode and package) is trimmed by changing the capacitance CREF of the reference capacitor 29. The value of the capacitance CREF is memorized as Creftrim1. Thus, in the production floor where the supply voltage VDD can be fixed, for a particular light source, for a particular trimmed and fixed integration time Tinttrim (fixed) and target gain of the AD converter 12 [represented by a target count Ntrim(fixed) of the AD converter 12], the optical path is trimmed by configuring the capacitance CREF of the reference capacitor 29 into a capacitance Creftrim1 through software according to the equation:

$$N\text{trim(fixed)} \cdot C\text{reftrim1} \cdot V\!D\!D\text{(fixed)} = I\!P\!D \cdot T\text{inttrim(fixed)}$$

Step 3: In production floor during the production phase PP the sensor current IPD is replaced by the calibration current ICAL. The AD converter 12 is used to trim the calibration current ICAL into Icaltrim while the supply voltage VDD is fixed, the capacitance CREF is fixed as Creftrim1, the integration time Tinttrim is fixed and the target count value Ntrim is fixed. Thus, Icaltrim is determined in the production phase PP, using the same setting as in step 2: For a fixed Creftrim1 and a fixed supply voltage VDD the AD converter 12 is reconfigured so that the sensor current IPD is replaced by the calibration current ICAL and the calibration current ICAL is changed so that the same AD converter output Ntrim(fixed) can be achieved in the same integration time Tinttrim(fixed). The final value of the calibration current ICAL is denoted as Icaltrim and its control code is denoted as Dcaltrim, following the equation:

$$N\text{trim(fixed)} \cdot C\text{reftrim1} \cdot V\!D\!D\text{(fixed)} = I\text{caltrim} \cdot T\text{inttrim(fixed)}$$

Step 4: The value Icaltrim or the control code Dcaltrim for Icaltrim is burnt into the memory 52 realized as OTA.

Step 5: In the field during the calibration phase CP, the supply voltage VDD is calibrated. That means that the capacitance CREF is changed into Creftrim2 to overcome variations of the supply voltage VDD. During power up or just before normal ambient light sensing, a calibration loop will be activated: The calibration current Icaltrim defined in steps 3 and 4 is used to trim the capacitance CREF into Creftrim2. The calibrated capacitance CREF is denoted as Creftrim2:

$$N\text{trim(fixed)} * C\text{reftrim2} * V\!D\!D = I\text{caltrim} * T\text{inttrim(fixed)}$$

Step 6: Furthermore in the calibration phase CP, the value Creftrim2 is stored in the control memory 54 that is realized as RAM. Thus, the control code Dcrefrim2 for Creftrim2 is memorized in the control memory 54.

Step 7: During the measurement phase MP in the field, the sensor current IPD is integrated for ambient light measurement while the value Creftrim2 is used. This results in a final ambient light sensor reading. The second digital output signal SDO2 (equal to count N of the AD converter 12) is determined representing brightness of the ambient light.

The optical sensor arrangement 10 achieves an ambient light sensor architecture without an area-consuming voltage reference, and comprises a circuit generating the integration time TINT and the calibration current ICAL. The optical sensor arrangement 10 is operated by a trimming process to achieve high precision.

I claim:
1. An optical sensor arrangement, comprising:
a light sensor;
a current source;
an analog-to-digital converter; and
a switch which selectively couples the light sensor or the current source to an input of the analog-to-digital converter,
wherein the analog-to-digital converter comprises an amplifier, an integrating capacitor and a reference capacitor,
wherein a first input of the switch is connected to the current source, a second input of the switch is connected to the light sensor and an output of the switch is coupled to an input of the amplifier via the input of the analog-to-digital converter,
wherein the integrating capacitor couples an output of the amplifier to the input of the amplifier,
wherein the reference capacitor is configured for providing a charge package to the input of the amplifier,
wherein the analog-to-digital converter comprises a first, second, third and fourth reference switch, wherein the first reference switch couples a supply voltage terminal to a first electrode of the reference capacitor,
wherein the first electrode of the reference capacitor is coupled to the input of the amplifier via the fourth reference switch,
wherein the second reference switch couples a reference potential terminal to a second electrode of the reference capacitor, and
wherein the third reference switch couples a first bias source to the second electrode of the reference capacitor.

2. The optical sensor arrangement according to claim 1, wherein the analog-to-digital converter is configured to generate a first digital output signal representing a value of a calibration current of the current source in a calibration phase and to generate a second digital output signal representing a value of a sensor current of the light sensor in a measurement phase.

3. The optical sensor arrangement according to claim 1, wherein a value of a calibration current of the current source is set by a trimming signal that is a digital signal.

4. The optical sensor arrangement according to claim 3, wherein the optical sensor arrangement comprises a memory and the trimming signal is determined by a value stored in the memory.

5. The optical sensor arrangement according to claim 1, wherein the analog-to-digital converter is realized as a charge balancing analog-to-digital converter.

6. The optical sensor arrangement according to claim 1, wherein the charge package depends on a capacitance value of the reference capacitor and a voltage value of a supply voltage.

7. The optical sensor arrangement according to claim 1, wherein the reference capacitor is configured such that a capacitance value of the reference capacitor is set by a trim control signal that is a digital signal.

8. The optical sensor arrangement according to claim 7, wherein the optical sensor arrangement comprises a control memory and the trim control signal is determined by a value stored in the control memory.

9. A method for light sensing, comprising:
selectively providing a calibration current of a current source or a sensor current of a light sensor to an input of an analog-to-digital converter,
wherein the analog-to-digital converter comprises an amplifier, an integrating capacitor, a reference capacitor, and a first, second, third and fourth reference switch,
wherein a first input of a switch is connected to the current source, a second input of the switch is connected to the light sensor and an output of the switch is coupled to an input of the amplifier via the input of the analog-to-digital converter,
wherein the integrating capacitor couples an output of the amplifier to the input of the amplifier,
wherein the reference capacitor is configured for providing a charge package to the input of the amplifier,
wherein the first reference switch couples a supply voltage terminal to a first electrode of the reference capacitor,
wherein the first electrode of the reference capacitor is coupled to the input of the amplifier via the fourth reference switch,
wherein the second reference switch couples a reference potential terminal to a second electrode of the reference capacitor,
wherein the third reference switch couples a first bias source to the second electrode of the reference capacitor,
wherein the current source is realized as a current mirror and comprises a first and a second current source transistor, and
wherein the first current source transistor couples the switch to the reference potential terminal.

10. The method according to claim 9, wherein the analog-to-digital converter generates a first digital output signal representing a value of the calibration current in a calibration phase and to generate a second digital output signal representing a value of the sensor current in a measurement phase.

11. The method according to claim 9, wherein a value of a calibration current is set by a trimming signal that is a digital signal.

12. The method according to claim 9, wherein the analog-to-digital converter is realized as a charge balancing analog-to-digital converter that comprises the reference capacitor having a capacitance value set by a trim control signal that is a digital signal.

13. An optical sensor arrangement, comprising:
a light sensor;
a current source;
an analog-to-digital converter; and
a switch which selectively couples the light sensor or the current source to an input of the analog-to-digital converter,
wherein the analog-to-digital converter comprises an amplifier and the switch is coupled to an input of the amplifier via the input of the analog-to-digital converter,
wherein the analog-to-digital converter comprises a reference capacitor which is configured for providing a charge package to the input of the amplifier,
wherein the reference capacitor is configured such that a capacitance value of the reference capacitor is set by a trim control signal that is a digital signal,
wherein the analog-to-digital converter comprises a first, second, third and fourth reference switch,
wherein the first reference switch couples a supply voltage terminal to a first electrode of the reference capacitor,
wherein the first electrode of the reference capacitor is coupled to the input of the amplifier via the fourth reference switch,
wherein the second reference switch couples a reference potential terminal to a second electrode of the reference capacitor, and
wherein the third reference switch couples a first bias source to the second electrode of the reference capacitor.

14. An optical sensor arrangement, comprising:
a light sensor;
a current source;
an analog-to-digital converter; and
a switch which selectively couples the light sensor or the current source to an input of the analog-to-digital converter,
wherein the current source is realized as a current mirror and comprises a first and a second current source transistor,
wherein the first current source transistor couples the switch to a reference potential terminal, wherein the analog-to-digital converter comprises an amplifier, a reference capacitor and a first, second, third and fourth reference switch, wherein the amplifier comprises an input connected to the input of the analog-to-digital converter, wherein the first reference switch couples a supply voltage terminal to a first electrode of the reference capacitor, wherein the first electrode of the reference capacitor is coupled to the input of the amplifier via the fourth reference switch, wherein the second reference switch couples the reference potential terminal to a second electrode of the reference capacitor, and wherein the third reference switch couples a first bias source to the second electrode of the reference capacitor.

* * * * *